United States Patent
Pehlke et al.

(10) Patent No.: US 6,738,432 B2
(45) Date of Patent: May 18, 2004

(54) SYSTEM AND METHOD FOR RF SIGNAL AMPLIFICATION

(75) Inventors: David R. Pehlke, Chapel Hill, NC (US); Aristotele Hadjichristos, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 396 days.

(21) Appl. No.: 09/813,741

(22) Filed: Mar. 21, 2001

(65) Prior Publication Data

US 2002/0136325 A1 Sep. 26, 2002

(51) Int. Cl.[7] .............................................. H04L 27/04
(52) U.S. Cl. .................... 375/300; 330/124 R; 455/108; 332/149
(58) Field of Search ................................ 375/268, 261, 375/295, 296, 297, 353, 300, 298; 445/93, 108, 210; 332/149, 152, 155, 159, 160, 161, 176; 330/295, 124 R, 126

(56) References Cited

U.S. PATENT DOCUMENTS

| 3,211,989 A | 10/1965 | Mintz et al. |
| 3,895,316 A | 7/1975 | Fein |
| 4,510,460 A | 4/1985 | Tamura |
| 5,136,300 A | 8/1992 | Clarke et al. |
| 5,497,125 A | 3/1996 | Royds |
| 5,828,205 A | 10/1998 | Byrne |
| 5,872,481 A | 2/1999 | Sevic et al. |
| 6,025,754 A | 2/2000 | Czora |

FOREIGN PATENT DOCUMENTS

| EP | 0558793 | 9/1993 |
| EP | 0772292 | 5/1997 |
| EP | 0887924 | 6/1998 |
| FR | 2766637 | 1/1999 |
| WO | WO48307 | 8/2000 |

OTHER PUBLICATIONS

U.S. patent application No. 09/738,971; Pehlke et al.; Filed Dec. 14, 2000; Title: System and Method of RF Power Amplification.
U.S. patent application No. 09/813,593; Hadjichristos et al.; Filed Mar. 21, 2001 Title: System and Method for Current–Mode Amplitude Modulation.

*Primary Examiner*—Don N. Vo
(74) *Attorney, Agent, or Firm*—Coats & Bennett, P.L.L.C.

(57) ABSTRACT

A branched power amplifier circuit includes two or more amplifier segments or branches, each with a corresponding lossy modulator. The branched power amplifier may be dynamically resized by enabling different ones of its branches, to deliver peak efficiency at a number of different amplifier output power levels. Each amplifier branch operates in a saturated mode and selectively amplifies an RF input signal. The lossy modulators provide either supply voltage or supply current modulation to corresponding amplifier branches, thus imparting highly linear amplitude modulation to the overall output signal generated by branched power amplifier, despite its saturated mode operation. The branched power amplifier circuit may be configured such that particular combinations of segments have peak efficiencies matched to the needs of one or more air interface standards used in wireless mobile communication systems.

54 Claims, 10 Drawing Sheets

SYSTEM AND METHOD FOR RF SIGNAL AMPLIFICATION

BACKGROUND OF THE INVENTION

The present invention generally relates to radio frequency (RF) signal amplification, and particularly relates to a method and apparatus for efficient, linear RF signal amplification.

Wireless communication devices, such as mobile telephones, two-way pagers, and the like, receive and transmit information via RF signaling. The pervasiveness of these devices places increasing demands on device manufacturers and wireless service providers to support ever greater numbers of users with increasingly sophisticated voice and data services, all while maintaining a consistently high quality of service.

The advent of digital modulation schemes allows greater numbers of users to be supported within a finite bandwidth. Such schemes also afforded, to varying degrees, opportunities for increased data rates, better data integrity, and enhanced data security. These benefits and others contributed to the success of wireless communication air interface standards such as the Global Services for Mobile Communications (GSM) standard, the Telecommunication Industry Association/Electronic Industry Association (TIA/EIA) standard TIA/EIA-136, and the TIA/EIA interim standard, IS-95.

These existing standards are evolving into so-called third generation (3G) standards, exemplified by the code division multiple access standards cdma2000 and wideband CDMA (W-CDMA). Other developing standards include the Evolution through Enhanced Data Rates (EDGE) extensions to GSM. These existing air interface standards are based on digital modulation schemes of varying sophistication. However, there exists a continuing trend toward requiring greater bandwidth efficiency and more sophisticated signal modulation techniques. Such modulation techniques include 8-PSK and 16-QAM, which are, respectively, phase shift keying (PSK) and quadrature amplitude modulation (QAM) techniques.

BRIEF SUMMARY OF THE INVENTION

The present invention provides a system and method for efficient, linear RF signal amplification over a range of transmit signal power. A branched power amplifier circuit comprises two or more power amplifier branches that may be selectively enabled in varying combinations based on, for example, required transmit signal power levels. Each power amplifier branch comprises a power amplifier biased for saturated mode operation. Each power amplifier, when enabled, provides efficient amplification for the RF input signal provided to the branched power amplifier. Typically, the RF input signal is a constant envelope signal. To impart desired amplitude modulation to the output signals from the power amplifiers, an amplitude modulation circuit powers selected power amplifier branches, while modulating either the supply voltage or supply current supplied to the branches.

Generally, the amplitude modulation circuit includes selection logic that enables or disables individual selected lossy modulators based on the branch selection signal. The lossy modulators, when enabled, provide power to corresponding ones of the power amplifier branches. Depending upon the implementation of the power amplifier branches, the lossy modulators are configured as variable resistive loads or controllable current sources. As a variable resistance, the lossy modulator controls the supply voltage provided to a supply input of a corresponding power amplifier branch responsive to an amplitude information signal. When configured as a controllable current source, each lossy modulator sets the supply current of its corresponding power amplifier branch based on the amplitude information signal.

The branched power amplifier may be configured so that the output power of individual branches, or selected combinations of the individual branches, is set at the point of peak operating efficiency for that branch or combination of branches. The output powers available from the branched power amplifier may be matched to the power control steps defined for one or more air interface standards. For example, IS-136 defines 4 dB steps in transmit signal power. In this sense, the branched power amplifier operates as a composite power amplifier having an "effective" device size that can be dynamically adjusted based on needed transmit signal power.

DETAILED DESCRIPTION OF THE INVENTION

Figure 1:
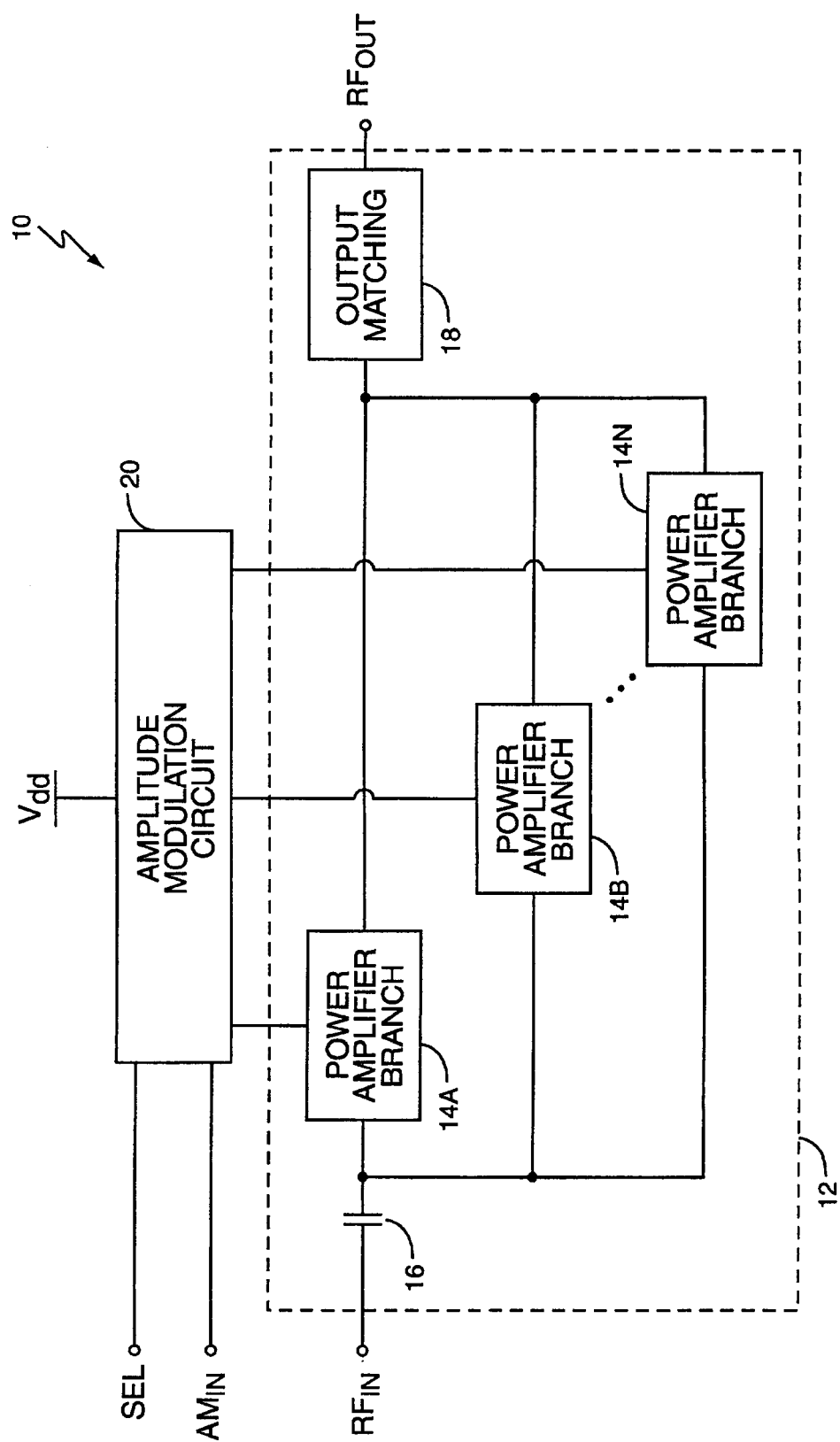
FIG. 1 is a diagram of an exemplary amplifier circuit in accordance with the present invention.

Turning now to the drawings, FIG. 1 is a diagram of an amplifier circuit, generally referred to by the numeral 10, in accordance with the present invention. The amplifier circuit 10 includes a branched or segmented power amplifier 12 that comprises a number of individual power amplifier branches 14A ... 14N, as well as an input coupling capacitor 16 and an output matching circuit 18. The branched power 12 amplifier generates a RF output signal denoted as $RF_{OUT}$ based on amplifying a RF input signal denoted as $RF_{IN}$. The amplifier circuit 10 further comprises an amplitude modulation circuit 20 to impart a desired amplitude modulation to the output signal $RF_{OUT}$.

In operation, the branched power amplifier 12 receives the RF input signal $RF_{IN}$, which it amplifies to generate the output signal $RF_{OUT}$ taken from the output matching circuit 18. The power amplifier branches 14A ... 14N are enabled individually or in desired combinations, depending upon, for example, power requirements for the output signal $RF_{OUT}$. Each branch 14, when enabled, operates in a saturated mode and provides a branch output signal generated by amplifying the input signal $RF_{IN}$ it receives from the input coupling capacitor 16. The branch output signals are combined at the output matching circuit 18 to form the final output signal $RF_{OUT}$ signal. The amplitude modulation circuit 20 operates to selectively enable individual ones of the branches 14, as well as to impart the desired amplitude modulation to the output signal $RF_{OUT}$.

In this exemplary architecture, un-enabled branches 14 remain connected to the input coupling capacitor 16 via their inputs, and remain connected to the output matching circuit 18 via their outputs. Thus, to a minor extent, the un-enabled branches 14 passively load the input and output signals $RF_{IN}$ and $RF_{OUT}$, respectively. The branched power amplifier 12 could be modified to include switches that selectively disconnect un-enabled branches 14, at the expense of added space and cost. Note that either the input coupling capacitor 16, or the output matching circuit 18, or both, may be omitted depending upon specific design details.

Figure 2A:
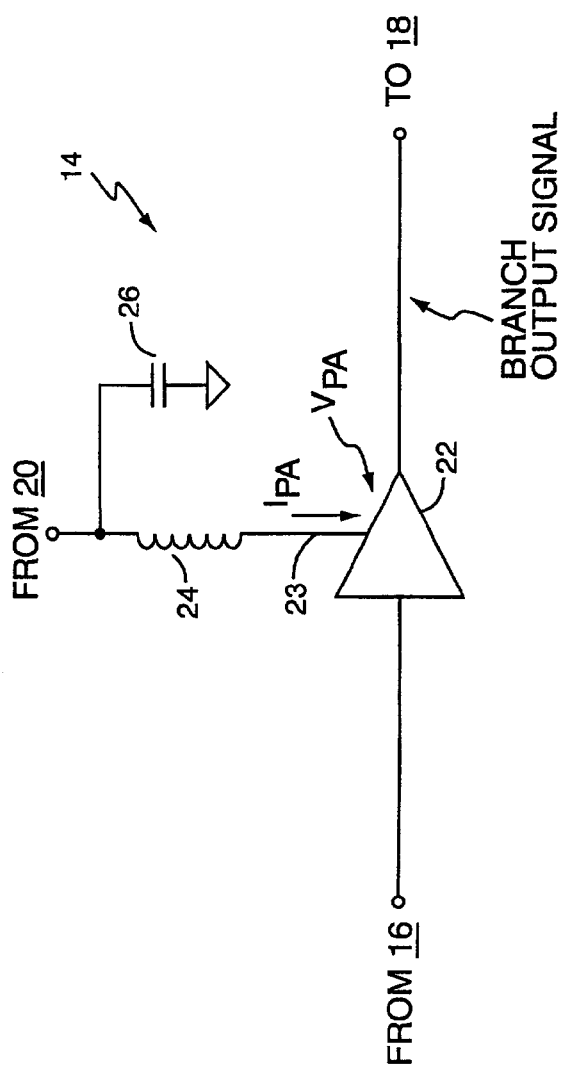
FIG. 2A is a diagram of a power amplifier used in the amplifier circuit of FIG. 1.

FIG. 2A is a diagram of any one of the branches 14 in the branched power amplifier 12. Each branch 14 includes a power amplifier 22 that receives the input signal $RF_{IN}$ from the coupling capacitor 16, which it amplifies to generate a branch output signal that is coupled along with the other branch output signals to the output matching circuit 18. As shown, the power amplifier 22 receives operating power, characterized by the power amplifier voltage $V_{PA}$ and the power amplifier current $I_{PA}$, on its supply input 23. As is discussed in more detail later, the amplitude modulation circuit 20 selectively powers each branch 14 in the branched power amplifier 12. In this exemplary context, a powered branch 14 is considered a "selected" or "enabled" branch 14. It should be understood that each power amplifier 22 may comprise a single power amplifier device, or a multi-stage power amplifier comprising two or more amplifiers.

Figure 2C:
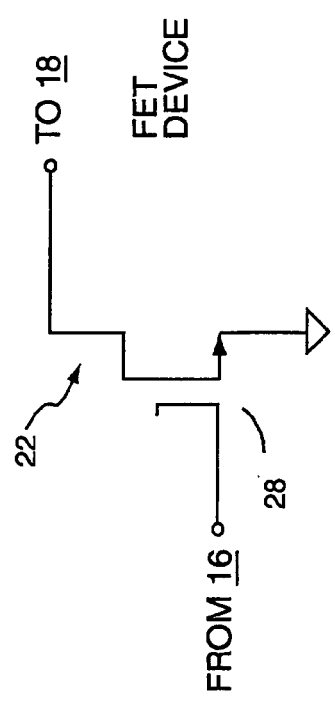
FIGS. 2B and 2C are diagrams of transistor amplifier device types associated with the power amplifier of FIG. 2A.
Figure 2B:
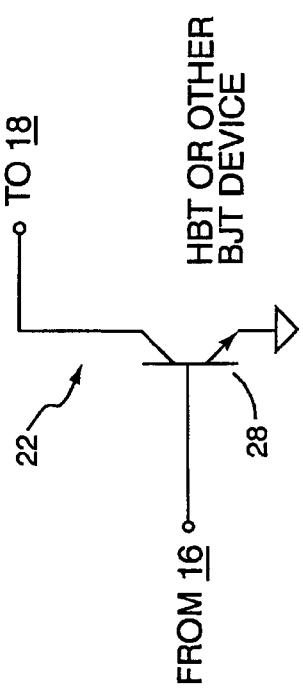

Typically, the power amplifiers 22 used in the branched power amplifier 12 are implemented in a common semiconductor process type. For example, the power amplifiers 22 may all comprise field-effect transistor (FET) devices, or may all comprise bipolar junction transistor (BJT) devices, such as heterojunction bipolar transistor (HBT) devices. FIG. 2B illustrates a simplified HBT implementation for the power amplifier 22. The power amplifier 22 comprises one or more transistor amplifiers 28, which, in the context of FIG. 2B, is illustrated as BJT device, such as an HBT. FIG. 2C is similar, but illustrates the transistor amplifier 28 as a FET device. As discussed later, implementation details of the amplitude modulation circuit 20 vary depending upon the amplifier device type chosen for the power amplifiers 22.

Figure 3:
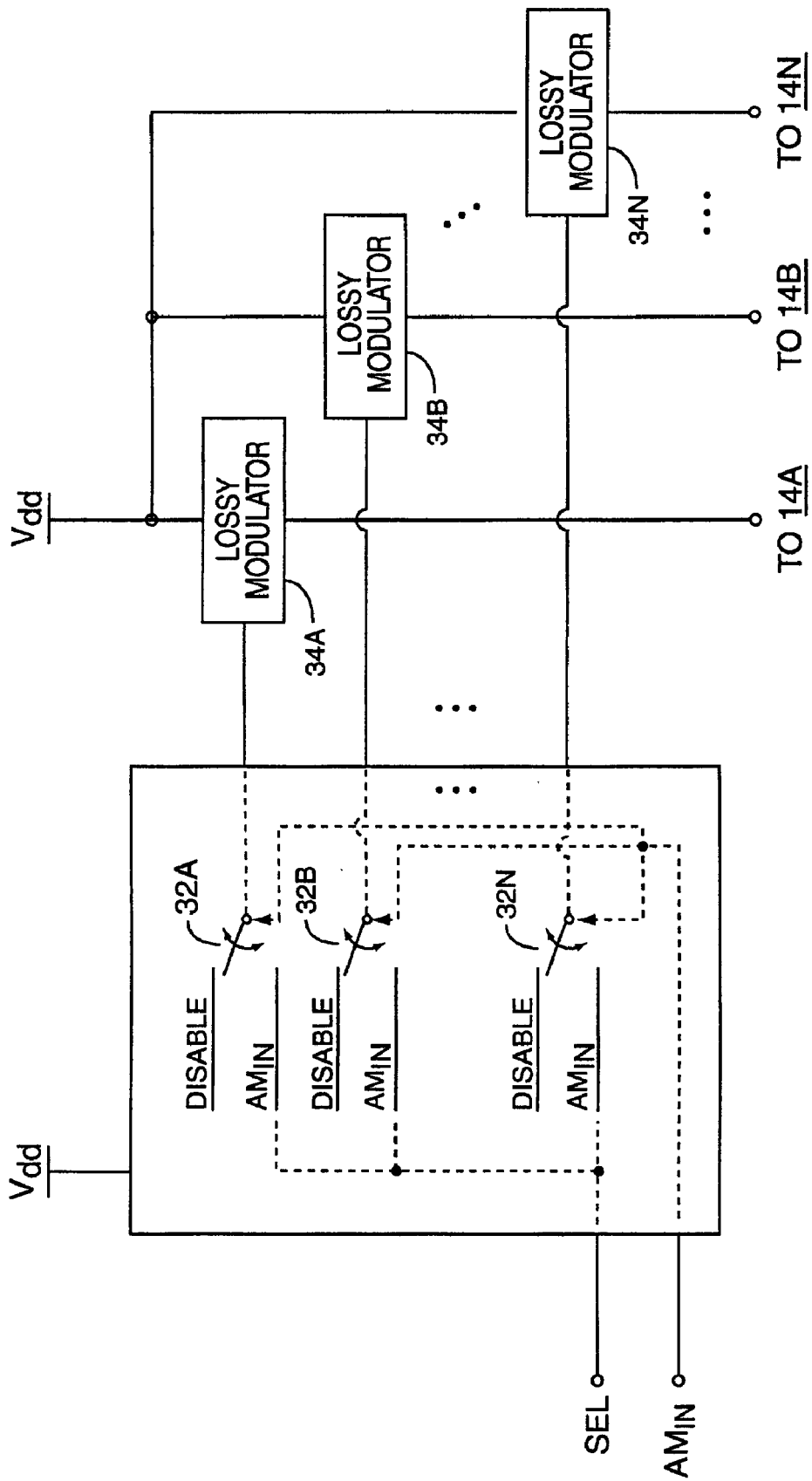
FIG. 3 is a diagram of the amplitude modulation circuit of FIG. 1.

FIG. 3 is a diagram of the amplitude modulation circuit 20 introduced in FIG. 1. The amplitude modulation circuit 20 includes selection logic in the form of a switching circuit 30 that includes switches 32A . . . 32N, and further includes a number of lossy modulators 34A . . . 34B. Generally, there is a one-to-one correspondence between the number of lossy modulators 34 and the number of branches 14 in the branched power amplifier 12. However, a single lossy modulator 34 may power more than one branch 14, if, for example, the commonly powered branches 14 will always be used simultaneously.

The switching circuit 30 receives a selection signal SEL( ), and an amplitude information signal $AM_{IN}$. Generally, individual switches 32 within the switching circuit 30 correspond to individual lossy modulators 34. Thus, switch 32A controls the lossy modulator 34A, switch 32B controls lossy modulator 34B, and so on. The selection signal SEL( ) may be an n-bit binary signal, with each bit controlling a corresponding one of the switches 32. Of course, virtually any selection signal format may be accommodated with appropriate interface logic in the switching circuit 30. In response to the selection signal SEL( ), each switch 32 either enables or disables its corresponding lossy modulator 34.

To enable the corresponding lossy modulator 34, the involved switch 32 couples the lossy modulator 34 to the amplitude information signal $AM_{IN}$. When connected to $AM_{IN}$, the lossy modulator 34 powers the corresponding branch 14 in the branched power amplifier 12. Depending on its configuration, the lossy modulator 14 modulates the operating power it supplies to the corresponding branch 14 by modulating the supply voltage $V_{PA}$ or the supply current $I_{PA}$ provided to the involved power amplifier 22. To disable the corresponding lossy modulator 34, the involved switch 32 couples the lossy modulator 34 to a disable signal, which may, for instance, simply be a static voltage level that shuts off the lossy modulator 34. Disabling a given lossy modulator 34 also disables the corresponding branch 14 in the branched power amplifier 12 by removing power from that branch 14.

Figure 4:
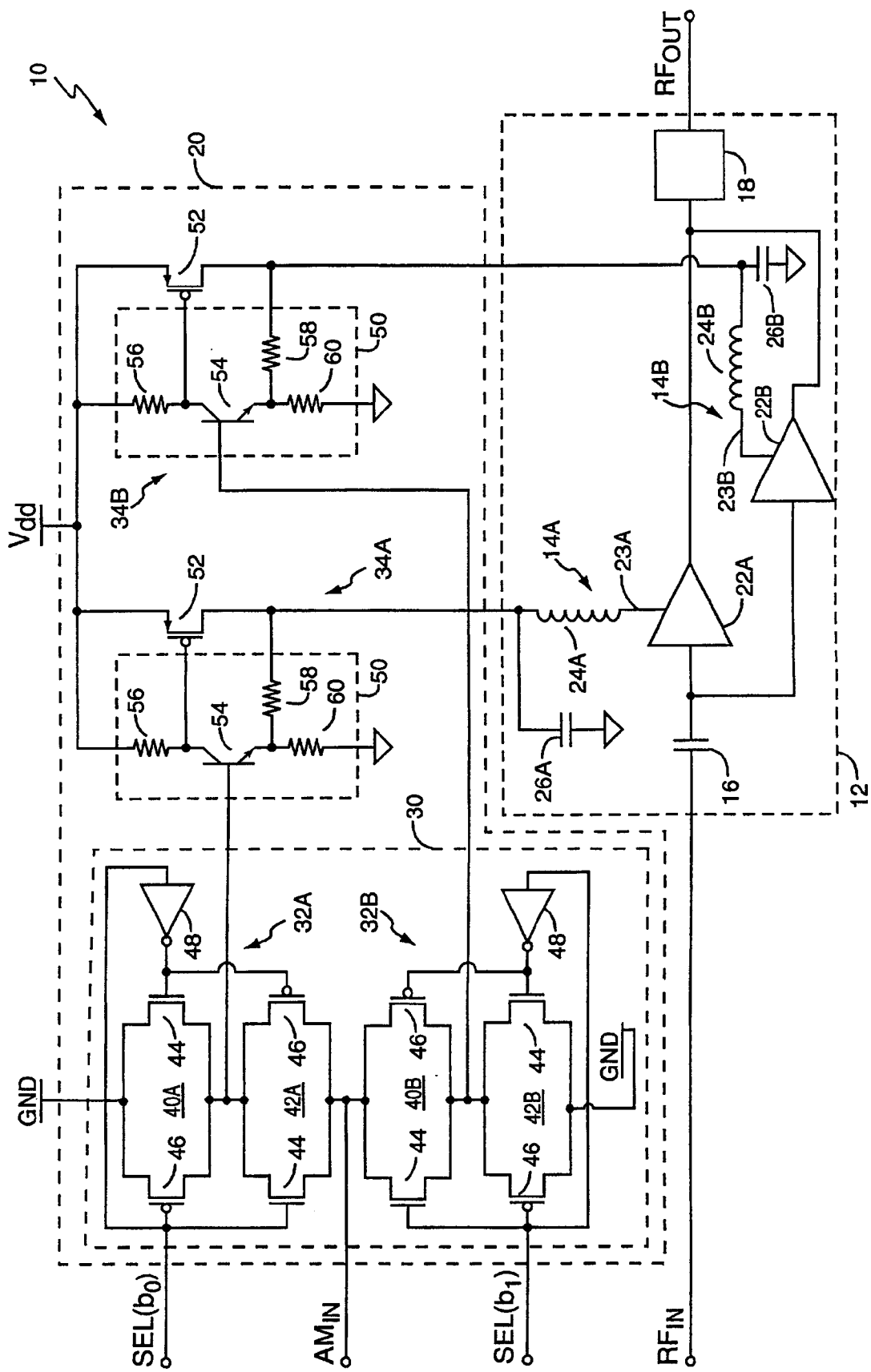
FIG. 4 is a diagram of the amplifier circuit of FIG. 1, and includes exemplary details for one configuration of the amplifier circuit.

FIG. 4 is a diagram of the amplifier circuit 10, including a voltage-mode implementation of the amplitude modulation circuit 20. Additionally, the diagram provides supporting details for an exemplary switching circuit 30. As will be shown later, this implementation of the amplitude modulation circuit 20 may have particular suitability for certain amplifier device technologies, such as when the power amplifiers 22 are based on FET-type devices. The co-pending application entitled, "System and Method of Current-Mode Amplitude Modulation," which is commonly assigned with the instant application, includes a more detailed discussion of the lossy modulators 34. The disclosure of that co-pending application is incorporated herein by reference.

The branched power amplifier 12 includes two branches 14A and 14B. Branch 14A comprises the power amplifier 22A, and its optional input filtering circuit comprising the RF choke 24A and shunt capacitor 26A. Likewise, branch 14B includes the power amplifier 22B, and, optionally, the inductor 24B and capacitor 26B. Branch 14A receives operating power on its supply input 23B when its corresponding lossy modulator 34A is enabled via the switching circuit 30. Similarly, branch 14B receives operating power on its supply input 23B from the lossy modulator 34B when it is enabled.

In this configuration, each lossy modulator 34 operates as a resistive load that varies with the amplitude information signal $AM_{IN}$. Thus, the voltage drop across the lossy modulator 34, when it is enabled, is a function of the amplitude information signal $AM_{IN}$. This variable-resistance operation modulates the supply voltage $V_{PA}$ presented to the supply input 23 of the corresponding branch 14, which imparts the desired amplitude modulation to the branch output signal.

The lossy modulators 34 are referred to as "lossy" because they operate by dissipating a portion of the power supplied to branched power amplifier 12. Each lossy modulator 34 comprises a control circuit 50 providing a control voltage to a pass transistor 52. The control circuit comprises a transistor 54, a collector resistor 56, and a feedback path or circuit implemented as a resistive voltage divider. The resistive voltage divider comprises a feedback resistor 58 and an emitter resistor 60. The divider establishes a feedback voltage at the emitter of the transistor 54, and the divider ratio formed by the feedback resistor 58 and the emitter resistor 60 sets the gain of the lossy modulator 34 with respect to the amplitude information signal $AM_{IN}$. Exemplary resistor values are 200 Ω for the collector resistor 56, 100 Ω for the feedback resistor 58, and 50 Ω for the emitter resistor 60.

The switching circuit 30 includes switches 32A and 32B corresponding to the lossy modulators 34A and 34B. Switch 34A comprises two complementary FET pairs 40A and 42A, while switch 34B similarly comprises the complementary FET pairs 40B and 42B. Each of the FET pairs 40A, 40B, 42A, and 42B, comprise complementary FETs 44 and 46. Each of the switches 32A and 32B further comprises an inverter 48, for generating an inverted version of the selection signal SEL( ). In operation, each switch 32 connects its corresponding lossy modulator 34 to the amplitude information signal in a first state, and to a disabling voltage level in a second state. A predetermined bit, e.g., b0 or b1, in the selection signal SEL( ) determines which state the switch 32 assumes.

While the above implementation yields good linearity of control for FET-based implementations of the branched power amplifier 12, HBT-based implementations of the branched power amplifier 12 may behave nonlinearly. Such non-linearity becomes a particular problem as the supply voltage $V_{PA}$ provided to the individual power amplifier 22 in the branched power amplifier 12 approaches the saturation voltage of the HBT devices used. To preserve a high degree of linearity with regard to the amplitude modulation action of the amplitude modulation circuit 20, the lossy modulators 34 may be implemented as current-mode devices. That is, the lossy modulators 34 may be configured as current sources providing amplifier supply current $I_{PA}$ as a function of the amplitude information signal $AM_{IN}$.

Figure 5:
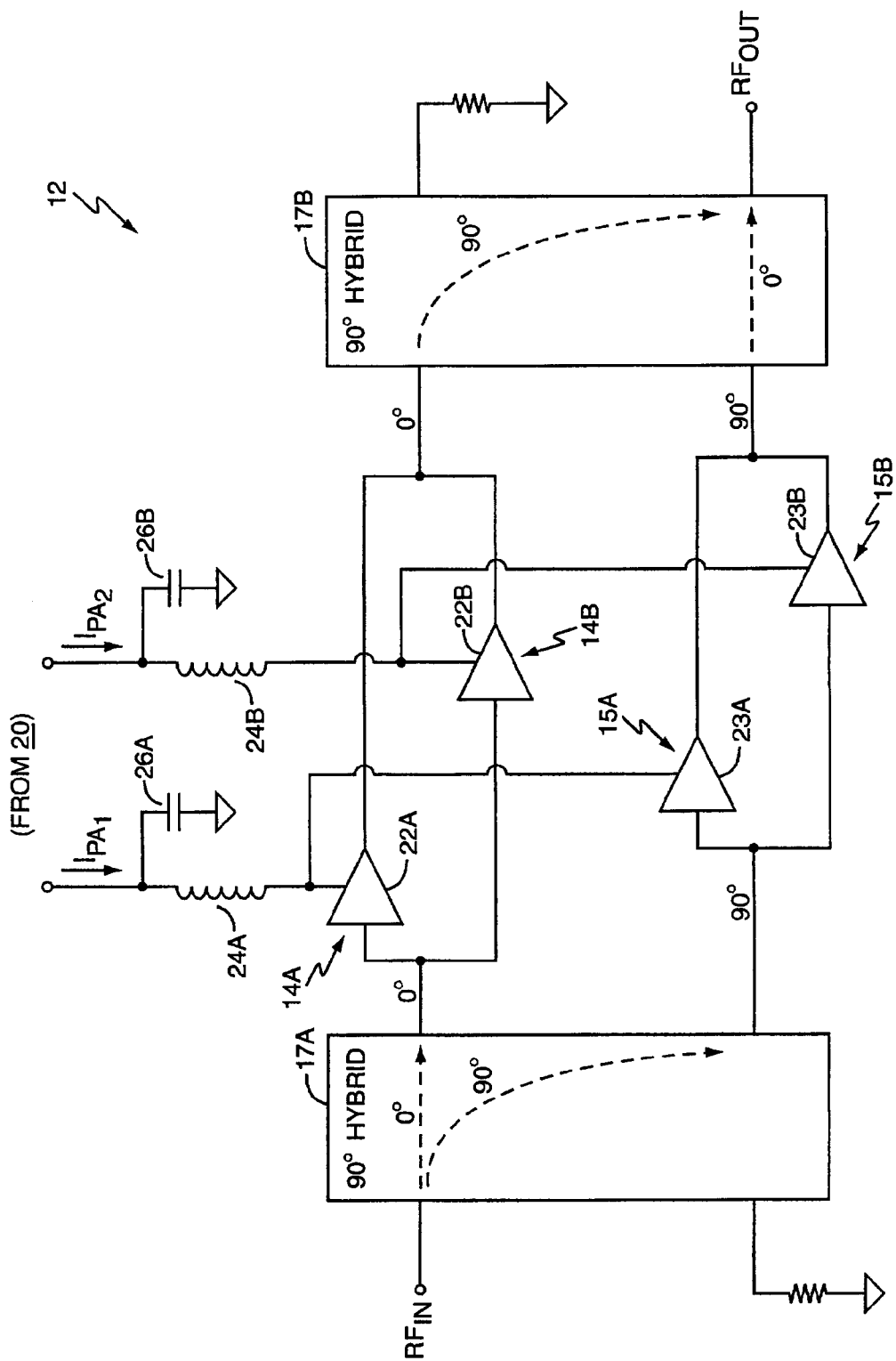
FIG. 5 is a diagram of an exemplary balanced, segmented amplifier configuration as might be used with the amplitude modulation circuits of FIG. 4 or 5.

FIG. 5 illustrates a balanced amplifier approach to the segmented power amplifier 12 introduced in FIG. 1. The segmented power amplifier 12 is organized as a first set of branches 14A and 14B comprising power amplifiers 22A and 22B, respectively, a corresponding second set of branches 15A and 15B comprising power amplifiers 23A and 23B, respectively, RF chokes comprising inductors 24A and 24B and capacitors 26A and 26B, an input hybrid circuit 17A, and an output hybrid circuit 17B.

Using a balanced amplifier configuration provides certain advantages in some circumstances. For example, with the segmented power amplifier 12 implementation of FIGS. 1 and 4, the output matching circuit 18 is typically configured to provide output impedance matching between the segmented power amplifier 12 and the output load, which usually comprises an antenna. When various ones of the amplifier branches 14 are selectively powered via the amplitude modulation circuit 20, the overall output impedance of the segmented power amplifier 12 may change, resulting in imperfect matching between it and the output matching circuit 18. Also, impedance mismatches may occur due to changes in antenna impedance, which is generally a function of the proximity and nature of objects in the antenna's environment.

The balanced amplifier approach illustrated in FIG. 5 minimizes the impact of such impedance mismatches. In this implementation, amplifier branches 14A and 14B form one half of the balanced, segmented power amplifier 12, with amplifier branches 15A and 15B comprising the other half. In exemplary operation, the branches 14 and 15 are enabled symmetrically. In other words, if 14A is enabled, the corresponding branch 15A is likewise enabled, with the same correspondence applying to branches 14B and 15B.

To accommodate this enabling scheme, a first lossy modulator 34 in the amplitude modulation circuit 20 provides modulated power to amplifier branches 14A and 15A, while a second lossy modulator 34 provides modulated power to amplifier branches 14B and 15B. For this implementation in general, the effective device size and corresponding peak output power operating efficiency of the balanced segmented power amplifier 12 may be varied by enabling various, balanced combinations of the amplifier branches 14 and 15.

In operation, the input signal $RF_{IN}$ is split into two phase shifted components by the input hybrid circuit 17A, with one component having a 0° phase shift relative to the input signal $RF_{IN}$ and the remaining component having a 90° relative phase shift. The RF isolation node formed at the resistor 19A provides effective termination of reflected signal power arising from input mismatches between the branches 14 and 15 and the input signal $RF_{IN}$.

The 0° component is selectively amplified by branches 14A and 14B, while the 90° component is selectively amplified by branches 15A and 15B. While the amplifier branches 14 and 15 usually impart some amount of phase shift to the amplified signal, the relative phase shift between the 0° and 90° components is maintained if each amplifier branch (e.g., 14A compared with 15A) imparts the same amount of phase shift. Thus, the relative phase difference between the amplified signals presented to the 0° and 90° inputs of the output hybrid circuit 17B is maintained.

The output hybrid circuit 17B combines the 0° and 90° components of the amplified signal to form the output signal $RF_{OUT}$. The RF isolation node provided at resistor 19B provides effective termination of reflected power from the $RF_{OUT}$ output, minimizing the effects of output impedance mismatch. Also, the total power of the RFOUT signal is sum of signal powers from the enabled amplifier branches 14 and 15, meaning that the total amplifier device die area needed by power amplifiers 22A, 22B, 23A, and 23B may be comparable to the die area needed by amplifiers 22A and 22B in the non-balanced approach of FIG. 4.

FIGS. 6A–6D provide exemplary details for current-source configurations of the lossy modulators 34. The co-pending application entitled, "System and Method of Current-Mode Amplitude Modulation," which is commonly assigned with the instant application, includes a more detailed discussion of the lossy modulators 34 as current sources. The disclosure of that co-pending application is incorporated herein by reference.

Figure 6B:
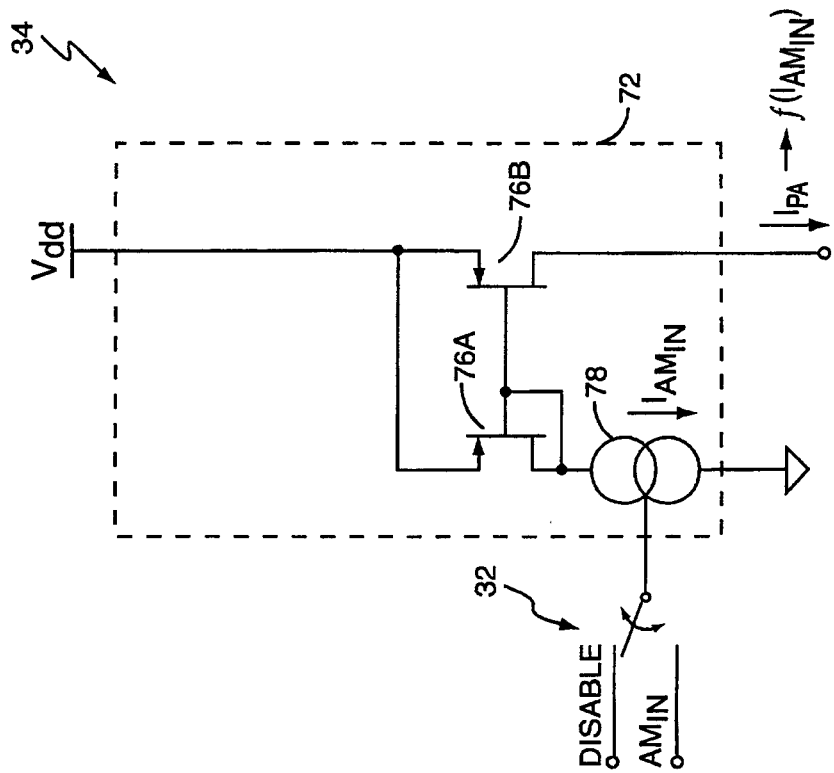
FIGS. 6A–6D are diagrams of exemplary variations for portions of the amplitude modulation circuit shown in FIG. 4.
Figure 6A:
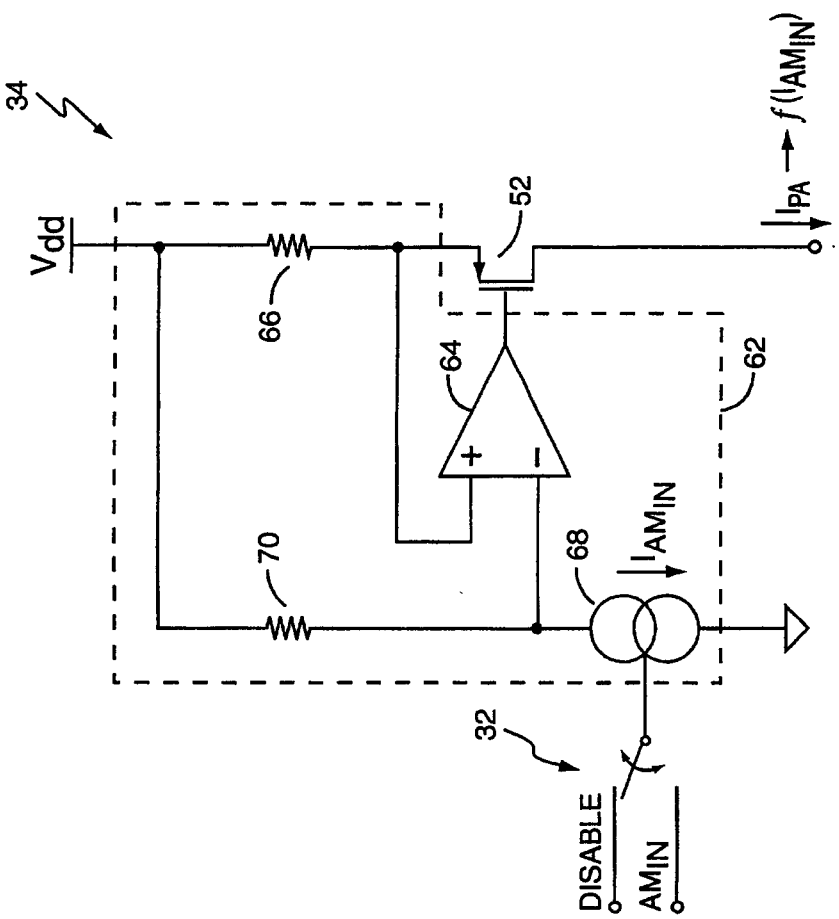

In FIG. 6A, the lossy modulator 34 (e.g., 34A, 34B, and so on) is configured as a current source responsive to the amplitude information signal $AM_{IN}$. That is, the lossy modulator 34 modulates the supply current $I_{PA}$ as a function of the $AM_{IN}$ signal, irrespective of resultant variations in the supply voltage $V_{PA}$. Note that the voltage ceiling established by the voltage $V_{dd}$, along with the maximum current limits of the involved circuit elements, establish limits on the range of the supply current $I_{PA}$.

The lossy modulator 34 includes a control circuit 60, which typically comprises an operational amplifier 64, a current sense resistor 66, a control current source 68, and a signal resistor 70. The lossy modulator 34 further includes the pass transistor 52. The associated switch 32 enables the lossy modulator 34 by connecting it with the $AM_{IN}$ signal, and disables it by connecting it with a disabling signal, such as signal ground or $V_{dd}$.

When enabled, the non-inverting input (+) of the operational amplifier receives a voltage that varies as a function of the amplitude information signal $AM_{IN}$. That is, the control current source 68 sources a current $I_{AMIN}$ through the signal resistor 70, generates the varying voltage at the non-inverting input of the operational amplifier 64.

The operational amplifier 64 receives a feedback voltage on its inverting input (−) that is a function of the supply current $I_{PA}$ provided by the lossy modulator 34 to the corresponding branch 14 in the branched power amplifier 12. The operational amplifier 64 generates a control voltage based on the voltage difference between its inverting and non-inverting inputs. This control voltage drives the gate (or base) of the pass transistor 52. Thus, the lossy modulator 34 modulates the supply current $I_{PA}$ as a function of the amplitude information signal $AM_{IN}$. This current modulation imparts the desired amplitude modulation to the branch output signal from the corresponding branch 14.

Because the sense resistor 66 exacts a slight efficiency penalty, that is, it dissipates some supply power to sense current, it is desirable to minimize its size. An exemplary sense resistor value is in the range of 100 mΩ. However, as the previously incorporated, co-pending application ("System and Method for Current-Mode Amplitude Modulation") discloses, the single sense resistor 66 may be replaced with two or more sense resistors, e.g., 66A, 66B, and so on. Each of the sense resistors 66 may then have a value best suited for a particular magnitude range of supply current $I_{PA}$. The amplifier circuit 10 can incorporate additional switching logic to select the appropriate sized sense resistor 66 responsive to a resistor selection signal. Alternatively, the amplifier circuit 10 could incorporate additional logic to select the appropriate resistor based on the magnitude of the supply current $I_{PA}$. This magnitude may be, for example, be inferred from the control voltage applied to the pass transistor 52.

FIG. 6B is similar in concept, but reflects an alternative implementation. Here, the lossy modulator 34 forgoes the sense resistor 66 by including a current source 72 that includes a pair of matched transistors 76A and 76B. A control current source 78 causes a control current that is modulated in accordance with the $AM_{IN}$ signal to flow through the control transistor 76A. The output transistor 76B is coupled to the control transistor 76A in a manner that causes it to provide the supply current $I_{PA}$ in proportion to the control current $I_{AMIN}$. The geometry of the output transistor 76B may be scaled relative to the control transistor 76A to establish a desired current mirror gain, thus setting the desired relationship between the instantaneous magnitude of the control current $I_{AMIN}$ and the supply current $I_{PA}$.

Figure 6D:
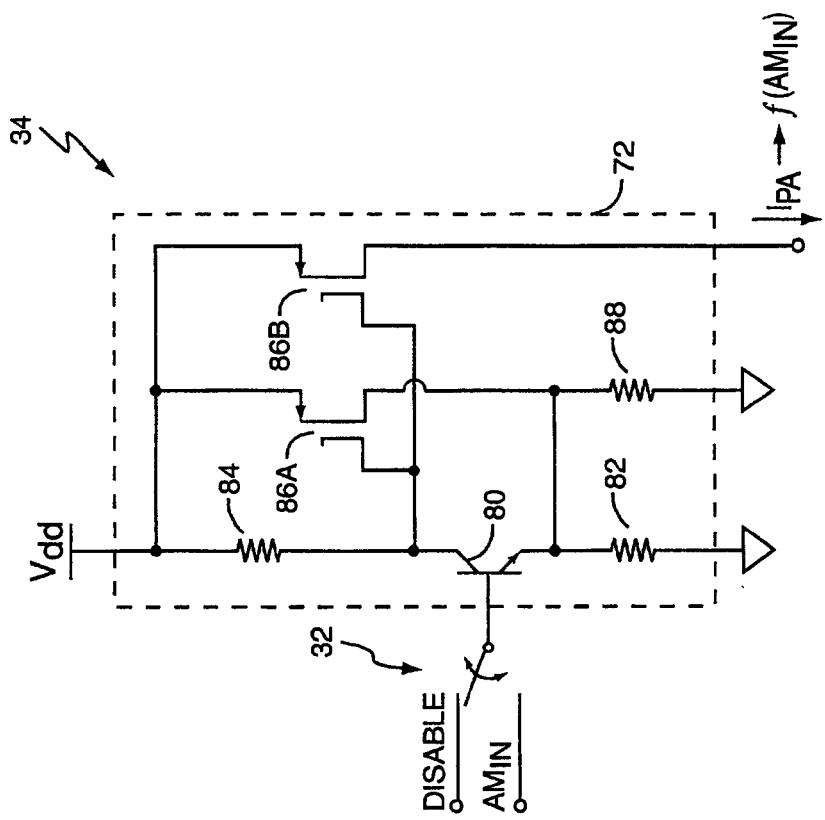
Figure 6C:
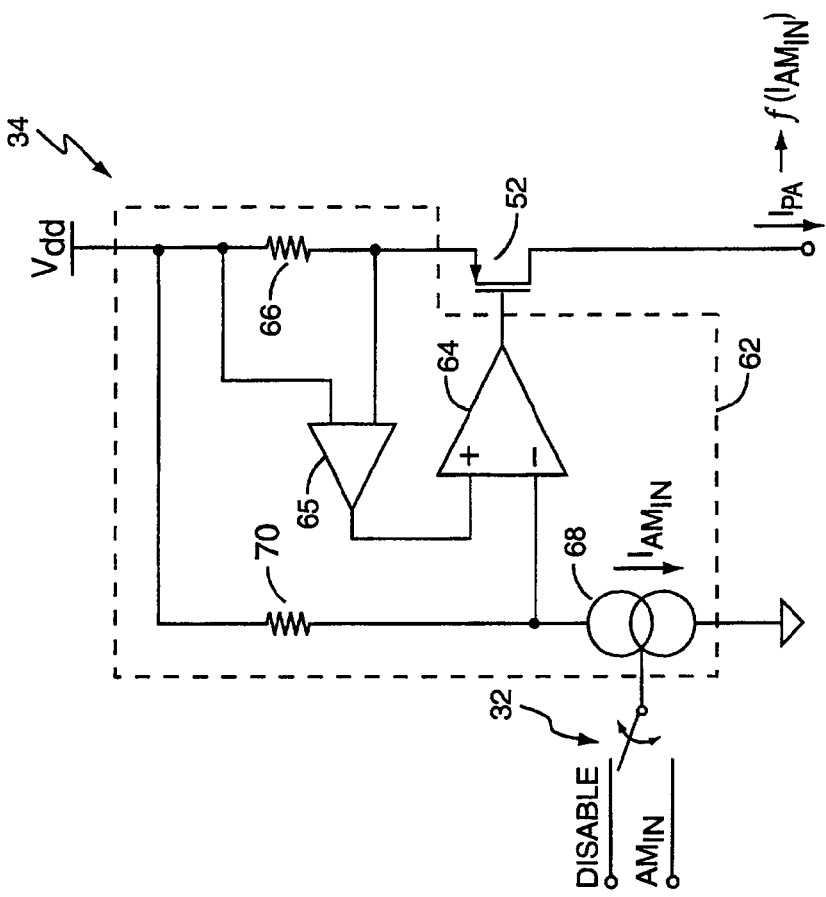

FIG. 6C illustrates a variation on the lossy modulator implementation shown in FIG. 6A. Here, the lossy modulator 34 includes an additional amplifier 65 disposed in the feedback path of the operational amplifier 64. The desire to avoid inefficiency limits the value of the current sense resistor 66, but using low values for the sense resistor 66 may be problematic in terms of higher bandwidth amplitude information signals $AM_{IN}$, such as might be encountered in Wideband CDMA (WCDMA) systems, and in other high data rate systems.

For example, the unity gain bandwidth of the operational amplifier 66 may be sufficient for adequately large feedback signals, but may be insufficient for very small feedback signals as might be expected from using a low-value sense resistor 66. By including amplification for the feedback signal itself in the form of amplifier 65, the performance requirements for amplifier 66 may be somewhat relaxed.

FIG. 6D illustrates an approach to power amplifier supply current modulation that may be particularly advantageous for higher bandwidth $AM_{IN}$ signals. Here, the current source 72 comprises an input transistor 80, an emitter degeneration resistor 82, a collector resistor 84, matched transistors 86A and 86B, and a fixed reference load in the form of a resistor 88.

The input transistor 80 and resistors 82 and 84 form an input circuit that generates a control voltage responsive to the $AM_{IN}$ signal. The control voltage drives the gate of transistor 86A, which sources a reference current into the reference resistor 88 responsive to the control voltage. The reference current generates a feedback voltage signal across the reference resistor 88, which is used to maintain closed-loop proportionality between the AMIN signal and the control voltage. The same control voltage controls the gate of the transistor 86B, which is matched to transistor 86A. Thus transistor 86B provides modulated supply current IPA proportional to the reference current into the reference resistor 88.

Figure 7:
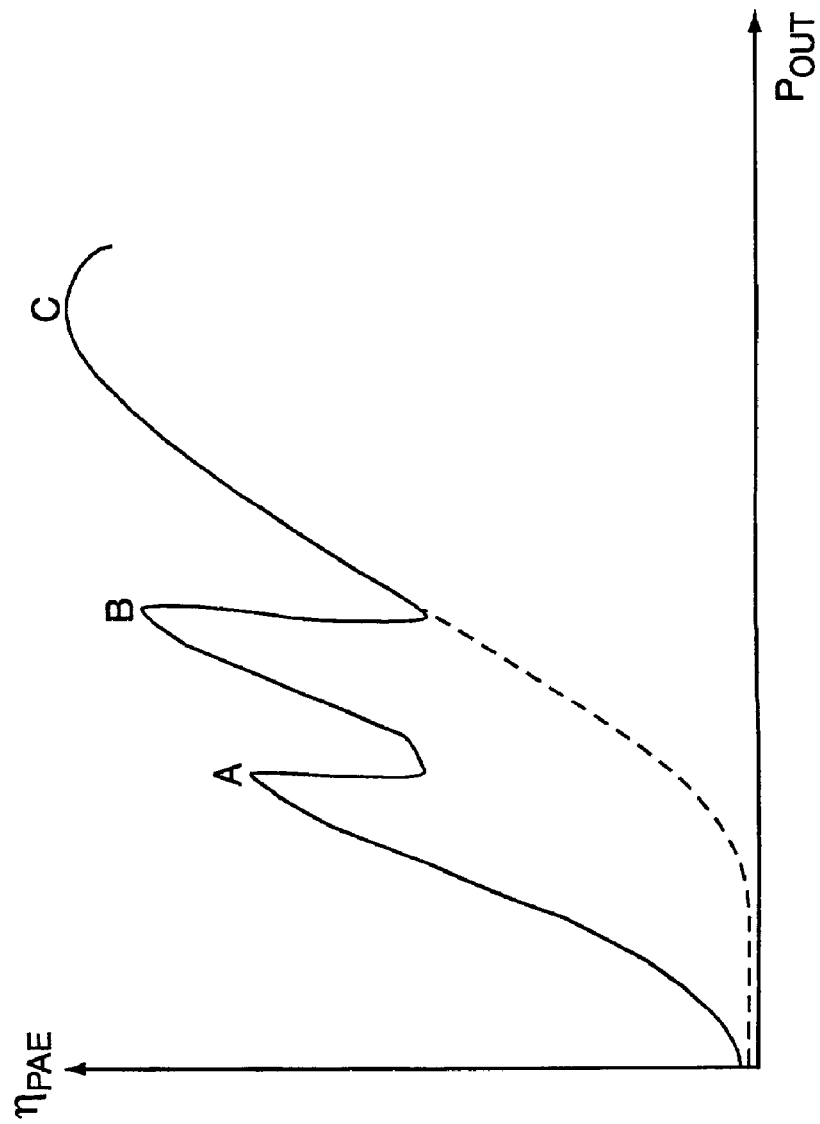
FIG. 7 is a diagram of exemplary peak operating efficiency versus output power for selectable configurations of the amplifier circuit of FIG. 1.

FIG. 7 diagrams the operating advantages of the branched power amplifier circuit 10. A power amplifier device, such as those used in the power amplifiers 22 within each branch 14 of the branched power amplifier 12, has a characteristic point of peak amplifier efficiency, denoted as $\eta_{PAE}$. This point is related to the size of the power amplifier device. Thus, for every required level of power for the output signal $RF_{OUT}$, there is a corresponding power amplifier device size that yields peak efficiency.

The branched power amplifier 12 may be thought of as a composite amplifier having an effective power amplifier device size that depends on which branches 14 are enabled. In this sense, by selecting the appropriate branch 14, or combinations of branches 14, the effective size of the branched power amplifier 12 may be adjusted as output signal power requirements change. Thus, the branched power amplifier 12 is configurable in the sense that different branches 14, or combinations of branches 14, may be enabled to effect different peak power efficiencies of the power amplifier 12.

FIG. 7 illustrates this by showing peak efficiency points "A," "B," and "C" as a function of required output power, and corresponding to three different configurations of enabled branches 14 in the branched power amplifier 12. As earlier noted, the branches 14 of the branched power amplifier 12 may be designed so that enabling different ones, or different combinations, matches the transmit signal power change increments specified by one or more wireless communication air interface standards. Examples of such standards may include TIA/EIA-136, GSM, GSM/EDGE, IS-95, IS-2000, and WCDMA.

Figure 8:
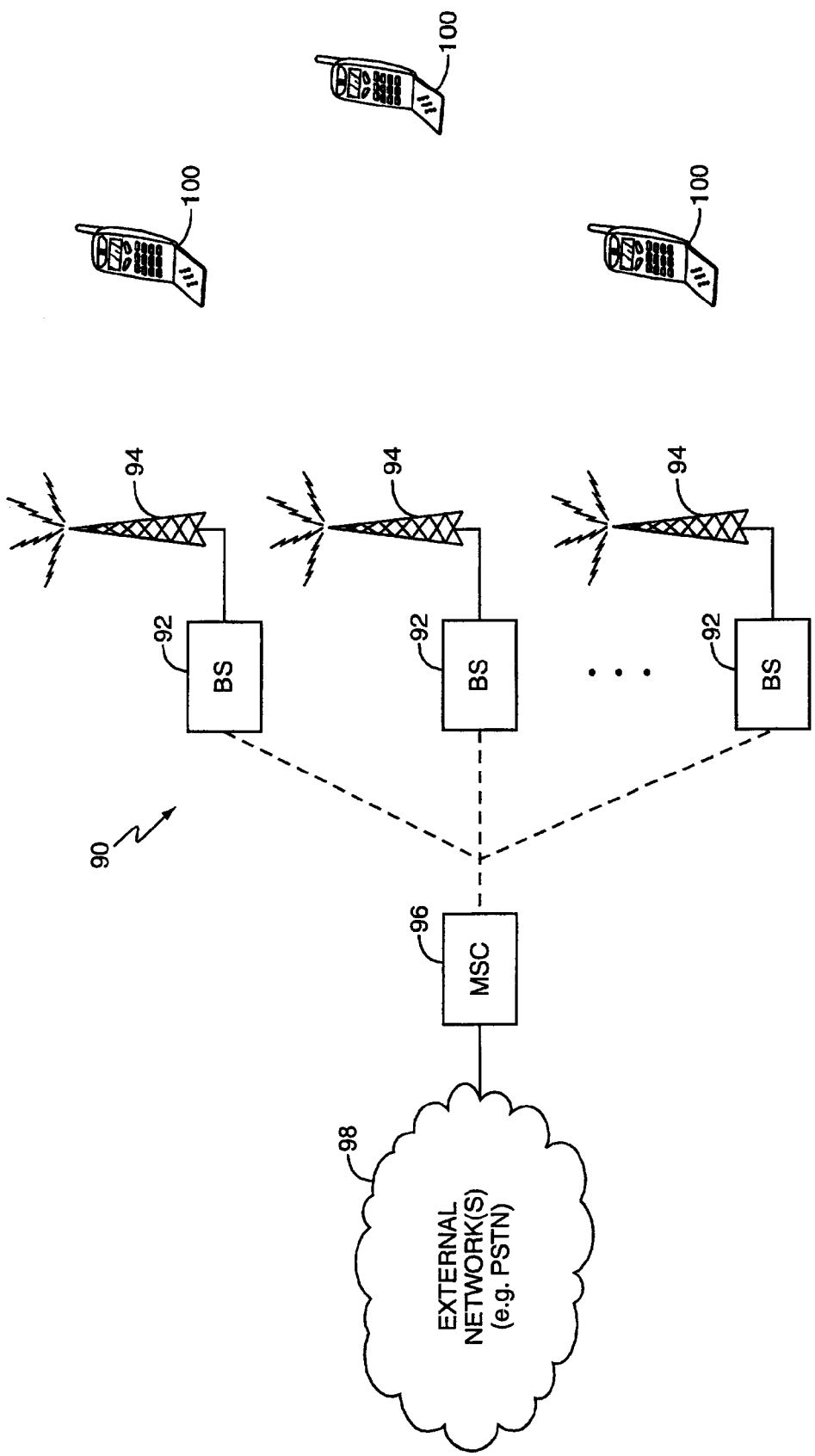
FIG. 8 is a diagram of an exemplary mobile network supporting wireless communication.

FIG. 8 is a diagram of an exemplary mobile network supporting wireless communications. The mobile network is generally referred to by the numeral 90, and includes one or more base stations 92, each with an associated receive/transmit antenna 94, one or more mobile switching centers (MSCs) 96 interfacing the base stations 92 with one or more external networks 98, and a plurality of mobile terminals 100. The mobile terminals 100 and, in some implementations, the base stations 92, may advantageously incorporate the amplifier circuit 10 introduced in FIG. 1.

Wireless signaling between the mobile terminals 100 and the base stations 92 support communications between the mobile terminal users and users of the external networks 88, as well as with other mobile terminal users. Each base station 92 supports communication and control traffic for mobile terminals 100 within the coverage area of its associated antenna 94. In turn, the MSC 96 coordinates and controls the functions of each base station 92, as well as interfacing communications traffic between the various base stations 92 and the external networks 98. The external networks 98 may include but are not limited to the Public Switched Telephone Network (PSTN), the Internet, and various Integrated Services Digital Networks (ISDN).

Figure 9:
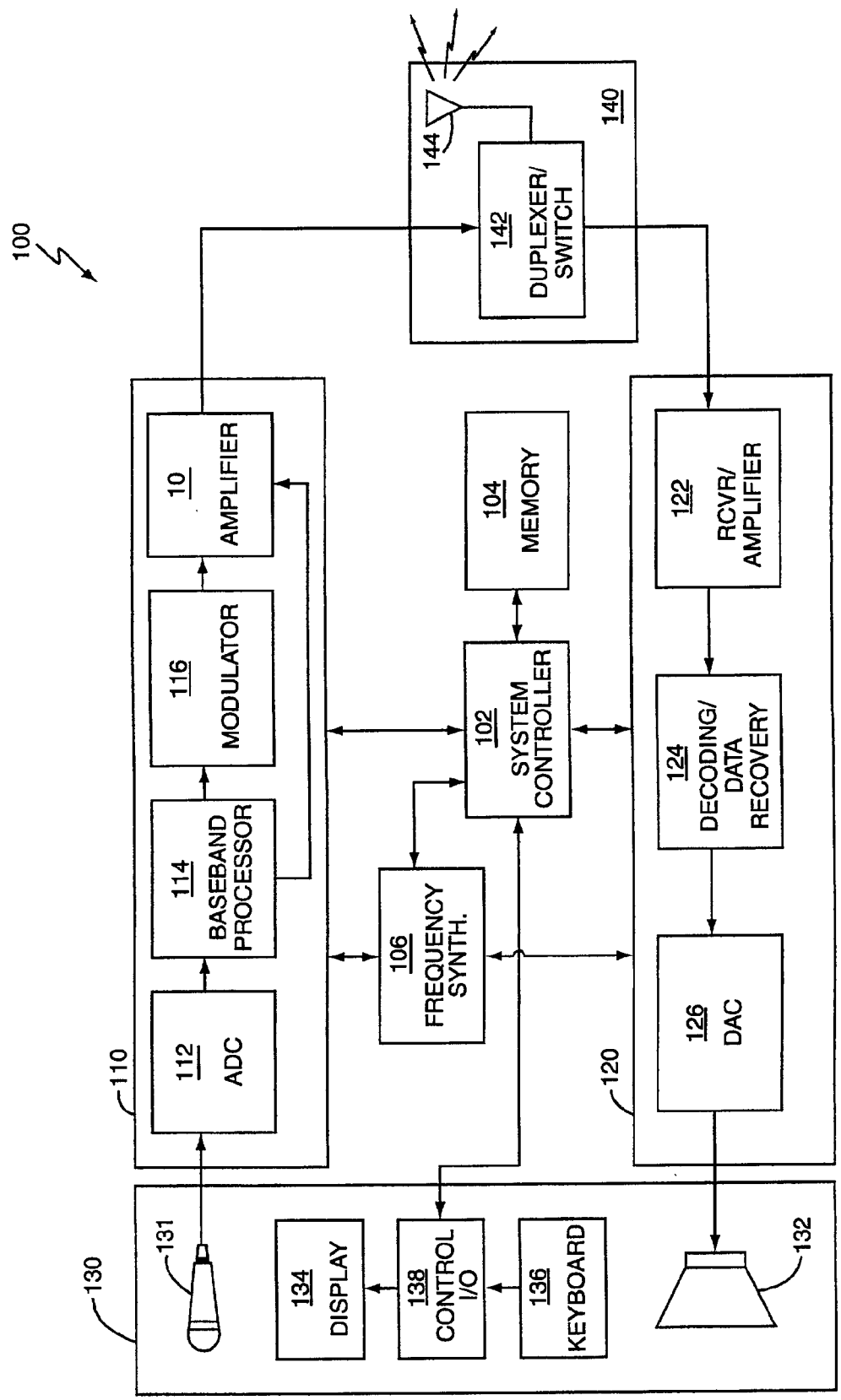
FIG. 9 is a diagram of an exemplary mobile terminal for use in the mobile network of FIG. 8.

FIG. 9 is a diagram of an exemplary implementation of the mobile terminal 100 used in the mobile network 90. The mobile terminal 100 includes a system controller 102, memory 104, a frequency synthesizer 106, a transmitter 110, a receiver 120, a user interface 130, and an antenna assembly 140.

In operation, the mobile terminal 100 sends and receives information via radio frequency signaling between it and a supporting base station 92. The system controller 102 is typically implemented as one or more microcontrollers (MCUs) that manage the user interface 130, and provide overall control of the mobile terminal 100. The memory 104 generally includes application software, default values for constants used in operation, and working space for data. The memory 104 may comprise several different memory devices or systems, and may include a variety of memory types. Examples of volatile memory types include static RAM (SRAM) and dynamic RAM (DRAM), while non-volatile memory types include FLASH and EEPROM.

The user interacts with the mobile terminal 100 via the user interface 130. A microphone 131 converts user speech signals into a corresponding analog signal, which is provided to the transmitter 110 for subsequent conversion, processing, and transmission to the base station 92 via the antenna assembly 140. The receiver 120 receives signals from the base station 92 and extracts received audio information, e.g., speech from a remote user, and provides a resulting audio signal for driving a speaker 132 included in the user interface 130.

The user interface 130 further includes a display 134 for providing visual information to the user, and a keypad 136 for accepting commands and data input from the user. The user interface 130 may include an I/O interface 138 for interfacing the display 134 and keypad 136 to the MCU 102. In short, the user interface 130 allows the user to send and receive speech and other audio information, to dial numbers, and to enter other data as needed. Also, as the received signal may contain non-audio data associated with advance data services, such as web browsing and email or other text messaging, the user interface 130 provides a mechanism for displaying non-audio information to the user.

The receiver 120 includes a receiver/amplifier 122, a decoding/data recovery module 124, and a digital-to-analog converter (DAC) 126. In operation, signals are received via the antenna 144, with the coupling circuit 142 providing signal isolation between received and transmitted signals. In some implementations, the coupling circuit 142 includes a receive/transmit switch to selectively connect either the transmitter 110 or the receiver 120 to the antenna 144. In other cases, the coupling circuit 142 includes a duplexer or other filter element to provide signal isolation during simultaneous receive and transmit operations. Note that the output matching circuit 18 of the branched power amplifier 12 may be configured based on the particular implementation of the antenna assembly 140.

Received signals are routed to the receiver amplifier 122, which provides conditioning, filtering, and down conversion of the received signal. In digital implementations, the receiver/amplifier 122 may use analog-to-digital converters (ADCs) to provide the decoding/data recovery module 124 with successive digital values corresponding to the incoming received signal. The decoding/data recovery module 124 recovers the audio information encoded in the received signal, and provides the DAC 126 with digital values corresponding to the received audio information. In turn, the DAC 126 provides an analog output signal suitable for driving the speaker 132. The decoding/data recovery module 124 also provides some non-audio data and control information that is extracted from the received signal to the system controller 102. Often, decoding/data recovery module 124 forms a portion of a digital signal processor (DSP).

The transmitter 110 is configured in accordance with the present invention and includes an analog-to-digital converter (ADC) 112, a baseband processor 114, a modulator 116, and the amplifier circuit 10 introduced earlier. In operation, the ADC 112 converts analog speech signals from the microphone 131 to corresponding digital values. The baseband processor 114 processes and encodes these digital values, typically providing error correction encoding, interleaving, and translation into a format suitable for the modulator 116. The baseband processor 114 may receive additional data for transmission from the system controller 102.

Depending upon the air interface standard used by the mobile terminal 100, the modulation scheme may require both amplitude and phase modulation of the transmit signal, denoted earlier as $RF_{OUT}$, radiated by the antenna 144. The baseband processor 114 typically encodes desired transmit information as a sequence of transmit symbols, with each symbol having a unique pairing of phase and amplitude values. The baseband processor 114 may split the phase and amplitude information into separate signals. Thus, it might generate a phase information signal, referred to as $\phi_{IN}$, synchronously with the amplitude information signal $AM_{IN}$, discussed earlier.

The modulator 116 uses the phase information signal $\phi_{IN}$ to modulate a carrier frequency signal, thus generating a carrier frequency signal having the desired phase modulation information. This modulated carrier frequency signal may serve as the RF input signal $RF_{IN}$ to the amplifier circuit 10. Note that the frequency synthesizer 106 may be used to generate a reference or carrier frequency signal for input to the modulator 116.

Thus, in this exemplary configuration, the amplifier circuit 10 receives the $RF_{IN}$ signal from the modulator 116 and the amplitude information signal $AM_{IN}$ from the baseband processor 114. The amplifier circuit 10 may be configured in accordance with any of the variations discussed earlier. The transmitter 110, using the power amplifier power supply techniques available with the amplitude modulation circuit 20 included in the amplifier circuit 10, is able to impart highly linear amplitude modulation to the transmit signal ($RF_{OUT}$), which is radiated by the mobile terminal 100 via its antenna 144.

While not shown in accompanying diagrams, it should be understood that the amplifier circuit 10 may include additional signal interface circuits depending upon the format of the amplitude information signal $AM_{IN}$ and the branch selection signal SEL( ). For example, if the $AM_{IN}$ signal comprises a high bit-rate output from a $\Delta\Sigma$ converter, which may comprise part of baseband processor 114, the amplifier circuit 10 may include an input filter to convert this bit stream into an analog signal. In other cases, the amplifier circuit 10 may include an ADC to convert the $AM_{IN}$ signal into an analog form. Likewise, interface circuitry for the SEL( ) signal may be needed to accommodate differing signal formats.

The present invention may, of course, be carried out in other specific ways than those herein set forth with departing from the scope and essential characteristics of the invention. Indeed, the present invention presents a generalized way to substantially prevent phase shift changes in a transmitted signal arising from changing transmitter configurations. These configuration changes may arise from the need to operate in different transmit signal power ranges, or from the need to make other types of changes in transmit signal generation. The present embodiments are therefore to be construed in all aspects as illustrative and not restrictive, and all changes coming within the meaning and equivalency of the appended claims are intended to be embraced herein.

What is claimed is:

1. An amplifier circuit comprising:
  an amplifier input to receive a RF input signal;
  at least two power amplifier branches coupled to said amplifier input, each said power amplifier branch selectively enabled to generate a branch output signal by amplifying said RF input signal while operating in a saturated mode;
  an amplifier output to combine said branch output signals into a RF output signal; and
  an amplitude modulation circuit to selectively provide power to said power amplifier branches, and to impart a desired amplitude modulation to said RF output signal by modulating said power provided to said power amplifier branches responsive to an amplitude information signal.

2. The amplifier circuit of claim 1 wherein each said power amplifier branch comprises a power amplifier device selectively powered by said amplitude modulation circuit in response to a branch selection signal to generate said branch output signal by amplifying said RF input signal.

3. The amplifier circuit of claim 1 wherein selected ones of said power amplifier branches powered by said amplitude modulation circuit comprise a composite power amplifier with an effective device size having a corresponding peak power efficiency, and wherein changing a branch selection signal to said amplitude modulation circuit dynamically changes said effective device size of said composite power amplifier and said corresponding peak power efficiency.

4. The amplifier circuit of claim 3 wherein said power amplifier branches are configured such that one or more combinations of said selected ones of said power amplifier branches have peak power efficiencies corresponding to transmit signal power change increments defined for at least one wireless communication air interface standard.

5. The amplifier circuit of claim 1 wherein said amplitude modulation circuit comprises:
  at least two lossy modulators, each said lossy modulator selectively providing modulated power responsive to said amplitude information signal to at least one corresponding power amplifier branch; and
  selection logic responsive to a branch selection signal to enable selected ones of said lossy modulators, thereby enabling said corresponding ones of said power amplifier branches.

6. The amplifier circuit of claim 5 wherein said selection logic comprises a switching circuit to couple a modulation input of selected ones of said lossy modulators to said amplitude information signal.

7. The amplifier circuit of claim 6 wherein said switching circuit comprises, for each of said lossy modulators, a switch to enable and disable a corresponding one of said lossy modulators based on said branch selection signal.

8. The amplifier circuit of claim 5 wherein each said lossy modulator comprises a voltage source responsive to said amplitude information signal to provide said modulated power by modulating a supply voltage provided by said lossy modulator to said corresponding ones of said power amplifier branches.

9. The amplifier circuit of claim 8 wherein each said lossy modulators comprises:
  a control circuit to generate a bias voltage linearly responsive to said amplitude information signal; and
  a pass transistor providing a modulated supply voltage to said corresponding one of said power amplifier branches responsive to said bias voltage.

10. The amplifier circuit of claim 5 wherein each said lossy modulator comprises a resistive load for coupling an operating voltage input of said corresponding one of said power amplifier branches to a supply voltage, each said lossy modulator operative to provide modulated power to said corresponding one of said power amplifier branches by varying the resistance of said resistive load responsive to said amplitude information signal.

11. The amplifier circuit of claim 10 wherein said resistive load comprises a pass transistor, and wherein each said lossy modulator further comprises a control circuit operative to control said pass transistor based on said amplitude information signal.

12. The amplifier circuit of claim 11 wherein said control circuit comprises:
  a bipolar junction transistor (BJT) with a base terminal driven by said amplitude information signal, a collector terminal coupled to a gate terminal of said pass transistor, and an emitter terminal;
  a collector resistor coupling said collector terminal of said BJT and said gate terminal of said pass transistor to said supply voltage;
  an emitter resistor coupling said emitter terminal of said BJT to a signal ground; and
  a feedback resistor coupling a drain terminal of said pass transistor to said emitter terminal of said BJT, said feedback resistor and said emitter resistor forming a voltage divider to feed back a voltage signal from said modulated power supplied to said corresponding ones of said power amplifier branches.

13. The amplifier circuit of claim 5 wherein each said lossy modulator comprises a current source responsive to said amplitude information signal to provide said modulated power by modulating a supply current provided by said lossy modulator to said corresponding ones of said power amplifier branches.

14. The amplifier circuit of claim 13 wherein said current source comprises a closed-loop control circuit to linearly vary said supply current responsive to said amplitude information signal.

15. The amplifier circuit of claim 14 wherein said closed-loop control circuit comprises:
  a current sensor to generate a feedback signal proportional to said supply current;
  a pass transistor responsive to a control signal to control said supply current; and
  an operational amplifier circuit to generate said control signal responsive to said feedback signal and said amplitude information signal.

16. The amplifier circuit of claim 15 wherein said operational amplifier circuit comprises:
  a first amplifier to generate an amplified feedback signal by amplifying said feedback signal from said current sensor; and
  a second amplifier to generate said control signal based on a difference between said amplified feedback signal and said amplitude information signal.

17. The amplifier circuit of claim 13 wherein said current source comprises a current mirror to control said supply current of said corresponding power amplifier branch responsive to said amplitude information signal.

18. The amplifier circuit of claim 17 wherein said current mirror comprises:
an input circuit to generate a control voltage signal proportional to said amplitude information signal;
a reference current circuit to generate a reference current into a reference load responsive to said control voltage signal, said reference load providing a feedback voltage signal to said input circuit to maintain proportionality between said amplitude information signal and said reference current; and
an output current circuit to control said supply current to said corresponding power amplifier branch proportional to said reference current into said reference load.

19. The amplifier circuit of claim 18 wherein said input circuit comprises a bipolar transistor comprising a base terminal coupled to said amplitude information signal, a collector terminal coupled to a supply voltage through a collector resistor, and an emitter terminal coupled to a signal ground through an emitter degeneration resistor, said emitter terminal further coupled to said feedback voltage signal from said reference load.

20. The amplifier circuit of claim 18 wherein said reference current circuit comprises a first field-effect transistor comprising a gate terminal coupled to said control voltage signal, a source terminal coupled to a supply voltage, and a drain terminal coupled to said reference load to provide said reference current proportional to said control voltage signal to said reference load.

21. The amplifier circuit of claim 20 wherein said output current circuit comprises a second field-effect transistor matched to said first field-effect transistor and comprising a gate terminal coupled to said control voltage signal, a source terminal coupled to said supply voltage, and a drain terminal to provide said supply current to said corresponding power amplifier branch proportional to said reference current into said reference load.

22. The amplifier circuit of claim 17 wherein said current mirror comprises:
a first transistor circuit to generate a control current responsive to said amplitude information signal; and
a second transistor circuit coupled to said first transistor circuit and disposed in a supply path of said corresponding power amplifier branch to control said supply current of said corresponding power amplifier branch proportionate to said control current.

23. The amplifier circuit of claim 17 wherein said current mirror comprises first and second matched transistor circuits with matched device geometries, wherein a scaling between said matched device geometries determines a current gain between said control current and said supply current provided to said corresponding power amplifier branch.

24. The amplifier circuit of claim 1 wherein each said power amplifier branch comprises at least one heterojunction bipolar transistor (HBT) device.

25. The amplifier circuit of claim 1 wherein each said power amplifier branch comprises at least one field-effect transistor (FET) device.

26. The amplifier circuit of claim 1 wherein said at least two power amplifier branches comprise balanced sets of power amplifier branches.

27. The amplifier circuit of claim 26 wherein said balanced sets of power amplifier branches comprise a first set of a plurality of power amplifier branches and a second set of a like plurality of power amplifier branches, wherein each said power amplifier branch in said first set has a corresponding power amplifier branch in said second set.

28. The amplifier circuit of claim 27 wherein said amplitude modulation circuit comprises a plurality of lossy modulators, each said lossy modulator selectively providing modulated power responsive to said amplitude information signal to a power amplifier branch in said first set and the corresponding power amplifier branch in said second set.

29. The amplifier circuit of claim 26 wherein said amplifier input comprises a first hybrid circuit to split said RF input signal into first and second phase shifted components, said first phase shifted component provided to a first set of power amplifier branches and said second phase shifted component provided to a second set of power amplifier branches, said first and second sets comprising said balanced sets of power amplifier branches.

30. The amplifier circuit of claim 29 wherein said amplifier output comprises a second hybrid circuit to combine amplified first and second phase shifted components from said first and second sets of power amplifier branches, respectively, to form said RF output signal.

31. A RF transmitter comprising:
signal processing circuitry to generate a phase modulation information signal and an amplitude modulation information signal corresponding to desired transmit signal information;
a phase modulator to generate a constant-envelope phase-modulated signal at a desired RF carrier frequency responsive to said phase modulation information signal; and
a branched power amplifier comprising:
an amplifier input to receive said constant-envelope phase-modulated signal as a RF input signal;
at least two power amplifier branches coupled to said amplifier input, each said power amplifier branch selectively enabled to generate a branch output signal by amplifying said RF input signal while operating in a saturated mode; and
an amplifier output to combine said branch output signals into a RF output signal; and
an amplitude modulation circuit to selectively provide power to said power amplifier branches, and to impart a desired amplitude modulation to said RE output signal by modulating said power selectively provided to said power amplifier branches responsive to said amplitude information signal.

32. The RF transmitter of claim 31 wherein said amplitude modulation circuit comprises at least two lossy modulators, each said lossy modulator selectively enabling at least one corresponding power amplifier branch by selectively providing modulated power to said corresponding power amplifier branch responsive to said amplitude information signal.

33. The RF transmitter of claim 31 wherein said amplitude modulation circuit further comprises selection logic to selectively enable each said lossy modulator, thereby selectively enabling said corresponding ones of said power amplifier branches.

34. The RF transmitter of claim 31 wherein each said power amplifier branch comprises a power amplifier device selectively powered by said amplitude modulation circuit to generate said branch output signal by amplifying said RF input signal when powered.

35. The RF transmitter of claim 31 wherein enabled ones of said power amplifier branches comprise a composite power amplifier with an effective device size having a corresponding peak power efficiency, and wherein changing a branch selection signal to said amplitude modulation circuit dynamically changes which ones of said power amplifier branches are enabled, thereby changing said effective device size of said composite power amplifier and said corresponding peak power efficiency.

36. The RF transmitter of claim 35 wherein said power amplifier branches are configured such that one or more combinations of said enabled ones of said power amplifier branches have peak power efficiencies corresponding to transmit signal power change increments defined for at least one wireless communication air interface standard.

37. The RF transmitter of claim 31 wherein said amplitude modulation circuit comprises:
    at least two lossy modulators, each said lossy modulator selectively providing modulated power responsive to said amplitude information signal to at least one corresponding power amplifier branch; and
    selection logic responsive to a branch selection signal to enable selected ones of said lossy modulators, thereby enabling said corresponding ones of said power amplifier branches.

38. The RF transmitter of claim 37 wherein each said lossy modulator comprises a variable resistance device providing said modulated power as a modulated voltage signal to said corresponding ones of said power amplifier branches.

39. The RF transmitter of claim 38 wherein said variable resistance device comprises:
    a control circuit to generate a bias voltage proportional to said amplitude information signal; and
    a pass transistor responsive to said bias voltage and operative as a variable resistance that couples a supply input of said corresponding ones of said power amplifier branches to a fixed supply voltage.

40. The RF transmitter of claim 39 further comprising a feedback circuit to generate a feedback signal from said modulated voltage signal to maintain linear operation of said control circuit with respect to said amplitude information signal.

41. The RF transmitter of claim 37 wherein each said lossy modulator comprises a resistive load for coupling a supply input of said corresponding ones of said power amplifier branches to a fixed supply voltage, each said lossy modulator operative to provide said modulated power by varying a resistance of said resistive load responsive to said amplitude information signal.

42. The RF transmitter of claim 37 wherein each said lossy modulator comprises a current source responsive to said amplitude information signal to provide said modulated power by modulating a supply current provided by each said lossy modulator to said corresponding ones of said power amplifier branches.

43. The RF transmitter of claim 42 wherein said current source comprises a closed-loop control circuit to linearly vary said supply current responsive to said amplitude information signal.

44. The RF transmitter of claim 42 wherein said current source comprises a current mirror generating a reference current proportional to said amplitude information signal, and mirroring said reference current as said supply current, such that said supply current is proportional to said reference current.

45. The RF transmitter of claim 31 wherein said at least two power amplifier branches comprise balanced sets of power amplifier branches forming a balanced power amplifier.

46. The RF transmitter of claim 45 wherein said amplitude modulation circuit comprises a plurality of lossy modulators, each said lossy modulator selectively providing modulated power responsive to said amplitude information signal to a power amplifier branch in a first set of power amplifier branches and to a corresponding power amplifier branch in a second set of power amplifier branches, said first and second sets of power amplifier branches forming said balanced sets of power amplifier branches.

47. The RF transmitter of claim 31 wherein said RF transmitter comprises a portion of a mobile terminal used in a wireless communication network.

48. The RF transmitter of claim 31 wherein said RF transmitter comprises a portion of a base station used in a wireless communication network.

49. An amplifier circuit comprising:
    an amplifier input to receive a RF input signal;
    at least two power amplifiers, each said power amplifier selectively enabled to generate a RF output signal by amplifying said RF input signal;
    an amplifier output to provide a combined RF output signal comprising said RF output signals generated by enabled ones of said at least two power amplifiers;
    at least two lossy modulators, each said lossy modulator selectively enabling at least a corresponding one of said power amplifiers by selectively providing modulated power responsive to an amplitude information signal to said corresponding one of said power amplifiers to impart desired amplitude modulation to said RF output signal.

50. The amplifier circuit of claim 49 wherein each said lossy modulator comprises a variable resistance device and selectively provides said modulated power to said corresponding one of said power amplifiers by varying a source resistance through which a supply voltage signal is provided to said corresponding one of said power amplifiers.

51. The amplifier circuit of claim 49 wherein each said lossy modulator comprises a variable current source and selectively provides said modulated power to said corresponding one of said power amplifiers by modulating a supply current provided to said corresponding one of said power amplifiers.

52. A method of generating a RF transmit signal with desired amplitude modulation information, the method comprising:
    generating a RF input signal at a desired transmit frequency;
    providing said RF input signal to set of parallel power amplifier branches, each said power amplifier branch having a corresponding peak power efficiency;
    selectively providing power to individual ones in said set of parallel power amplifier branches to generate said RF transmit signal based on a desired transmit power for said RF transmit signal; and
    modulating the power provided to said selectively powered individual ones in said set of parallel power amplifier branches to impart said desired amplitude modulation information to said RF transmit signal.

53. The method of claim 52 wherein modulating the power provided to said selectively powered individual ones in said set of parallel power amplifier branches to impart said desired amplitude modulation information to said RF transmit signal comprises varying a source resistance of supply voltages providing operating voltage to said selectively powered individual ones of said parallel power amplifier branches in accordance with said desired amplitude modulation information.

54. The method of claim 52 wherein modulating the power provided to said selectively powered individual ones in said set of parallel power amplifier branches to impart said desired amplitude modulation information to said RF transmit signal comprises varying supply currents provided to said selectively powered individual ones in said set of parallel power amplifier branches in accordance with said desired amplitude modulation information.

* * * * *